United States Patent [19]

Tang et al.

[11] Patent Number: 5,930,323
[45] Date of Patent: Jul. 27, 1999

[54] ULTRA FAST SHIFT REGISTER USING RESONANT TUNNEL DIODES

[75] Inventors: Hao Tang, Laurel, Md.; Tom P. E. Broekaert, Dallas, Tex.

[73] Assignee: Texas Instruments Incorporation, Dallas, Tex.

[21] Appl. No.: 08/918,320

[22] Filed: Aug. 26, 1997

[51] Int. Cl.[6] .................................................. G11C 19/00
[52] U.S. Cl. ................................ 377/77; 377/78; 377/79; 377/128; 326/134; 327/498; 327/499; 327/568; 327/570
[58] Field of Search ................................ 326/17, 93, 134; 327/498, 499, 568, 470; 377/77–79, 128

[56] References Cited

U.S. PATENT DOCUMENTS 5,444,751  8/1995  Sage ........................................... 377/78

*Primary Examiner*—Margaret R. Wambach
*Attorney, Agent, or Firm*—Christopher L. Maginnis; W. James Brady III; Richard L. Donaldson

[57] ABSTRACT

A high speed digital static shift register includes a series-connected pair of resonant tunneling diodes (RTDs) 22, 24 to achieve a bistable operating state. A clocked switch 20 provides the means of setting the binary state of this bistable pair. In order for one bistable pair to drive a following pair, a method of providing isolation and gain using a buffer amplifier 26 between the two pairs of RTDs is also provided. In one embodiment, the buffer amplifier comprises enhancement FET 30 and depletion load FET 28.

15 Claims, 4 Drawing Sheets

ULTRA FAST SHIFT REGISTER USING RESONANT TUNNEL DIODES

The U.S. Government has rights in this invention pursuant to Contract No. 93-F-4106, awarded by the U.S. Government.

RELATED APPLICATIONS

This application includes subject matter which is closely related to U.S. patent application No. 60/017,764, "Reset Circuit For Resonant Tunnelling Devices and Systems," filed May 16, 1996; U.S. patent application No. 60/017,762, "Resettable Latched Voltage Comparator," filed May 16 1996; and U.S. patent application No. 60/021,165, "Memory Cell Having Negative Differential Resistance Devices," filed Jul. 1, 1996.

TECHNICAL FIELD OF THE INVENTION

The present invention relates generally to electronic circuits and, more specifically to very high speed digital shift registers using negative resistance devices such as resonant tunneling diodes and the like.

BACKGROUND OF THE INVENTION

Extensive prior art exists in the application of two terminal negative resistance devices developed after the publication by Leo Esaki of "New Phenomenon in Narrow Germanium p-n Junctions", Phys. Rev., Vol. 109, p. 603, Jan. 15, 1958. However, as the title of the article indicates, a resonant tunnel diode (RTD) with its plurality of thin semiconducting layers having different physical properties is markedly different from Esaki's single p-n junction. Although the shape of the plot of device current vs. voltage is superficially similar, the scale is grossly different. In addition, the manufacturing technology available to achieve massive arrays of virtually identical RTDs is not available for Esaki tunnel diodes. In its simplest form, an RTD consists of a sequence of five semiconductor layers. The outer two layers are the contact layers into which electrons enter and exit the semiconductor layer sequence. The interior three dissimilar semiconductor layers differ in their energy band gaps in the sequence of wide/narrow/wide band gap with layer thicknesses comparable to the electron Bloch wavelength (typically less than 10 nm). The electron path through these layers consists of two energy barriers separated by a narrow region referred to as a quantum well.

Classically, an electron with energy, called Fermi energy, approaching the first energy barrier with an energy below the barrier energy is reflected. As the physical dimensions of the barrier decrease toward the wavelength of the particle, there is an increasing probability that the particle will be transmitted instead of reflected. Thus, under certain conditions, an electron can pass through the barrier with energy below the barrier potential. This phenomenon is called tunneling.

If the quantum well width is selected to be approximately equal to some half integer multiple of the electron wavelength, a standing wave can be built up by constructive interference analogous to the standing waves in a transmission line or microwave cavity. Electrons at these wavelengths couple into and out of the quantum well more readily than others.

Since the electron's energy can be controlled by adjusting the voltage across the structure, the current flow through the double barrier is quite sensitive to this applied voltage. For certain applied voltages, the electrons readily pass through the double barrier and for other applied voltages are almost totally reflected. The electron is said to be in resonance when the incoming electron energy matches the resonant transmission energy of the quantum-well structure.

The prior art shown in FIG. 1, "Resonant Tunneling Transistors," TI Technical Journal, p.30, Jul–Aug 1989, shows the current vs. voltage (I–V) characteristic and the corresponding conduction band profile of an RTD. The interesting feature of this characteristic is that between points B and C where an increase in applied voltage actually causes a decrease in device current. This region of "negative differential resistance" is highly unstable. The ratio of the voltage at B to C is referred to as the peak-to-valley ratio and is quite important in determining the noise margins of RTDs applied to digital devices. The previously mentioned scale differences in these characteristics between RTDs and older Esaki single junction tunnel diodes is quite dramatic. RTDs can be fabricated whose peak currents are reproducible from device to device and may range from 100 picoamps to greater than 100 milliamps while maintaining useable peak to valley ratios. Esaki diodes operate in the tens of milliamps regime. This allows RTDs to be tailored to the application. In memory devices where power and size are the prime concerns, very low current devices are the choice. In high speed logic where capacitive loads may occur, high current devices are desired.

As has been done in prior art, adding a resistor in series with the diode as illustrated in FIG. 2 achieves a bistable circuit whose static resting point is either 10 or 12. By applying a control voltage at 14, the device can be forced to either 10 or 12 making it into a resettable binary latch. This structure is disadvantageous because of (1) power dissipation, (2) manufacturability and (3) operating speed among other problems.

A more suitable structure is to series connect two RTDs in a manner similar to that proposed by Goto, et al in IRE Trans. on Electronic Computers, March 1960, p. 24 using conventional Esaki tunnel diodes and studied extensively by RCA, RCA Review, vol XXXIII, June 1962, p. 152 and Dec. 1962, p. 489. The series connection of two RTDs and their bistable operating points 16 and 18 is illustrated in FIG. 3. It is this configuration which is exploited by this invention.

Modern digital systems require the acquisition, transfer and storage of digital bit streams at gigahertz clock frequencies. Most systems in this frequency range use a continuous or synchronous clock with dynamic shift registers. A dynamic shift register stores the binary ones and zeroes in capacitors, normally the parasitic capacitances of the circuit interconnects. However, in many systems the data stream is asynchronous, i.e. stops and starts. However, in a dynamic system, the data may be lost due to capacitor leakage if the clock is stopped for too long a period. The faster the clock the smaller the capacitor and the sooner the data is lost if the clock stops. A static shift register can be used to overcome this difficulty. However, static circuits require more components and hence device and interconnect delays. Many times these circuits also dissipate considerably more power than their dynamic counterparts. As seen in FIG. 3, both stable points 16 and 18 are at low current.

SUMMARY OF THE INVENTION

It is a primary objective of the present invention to overcome the above mentioned difficulties by providing means to interconnect shift registers for the transmission and storage of ultra high speed (>1 GHz) bit streams using an asynchronous clock while maintaining small size.

The present invention includes a cascaded pair of RTDs to achieve a bistable operating state. A means of setting the binary state of this bistable pair is also provided. In order for one bistable pair to drive a following pair, a method of providing isolation and gain using a buffer amplifier between the two pairs of RTDs is also provided.

Some alternate means for achieving the buffer isolation between shift register stages while still retaining high speed and small size are shown as illustrative but are not meant to be restrictive.

After the receipt of data transmitted at a rate above a gigahertz, it is often desired to store this data and then transmit the same data at a slower rate so that the data may be stored and processed by slower more conventional digital systems. This can be conveniently implemented by this ultra high speed static shift register invention by clocking the shift register at a very high rate during data reception, and then a much slower clock rate. This slower clock frequency may be preceded by a short delay in order to be synchronous with the downstream clock frequency if desired. The data in the shift register may then be clocked out at a lower rate. A source follower is provided to drive downstream digital processing circuitry where capacitive loading may otherwise cause problems.

BRIEF DESCRIPTIONS OF THE DRAWINGS

The foregoing features of the present invention may be understood more fully from the following detailed description, read in conjunction with the accompanying drawings in which like numerals and symbols are employed to designate similar components in various views unless otherwise indicated:

DESCRIPTION OF PREFERRED EMBODIMENTS

Figure 1:
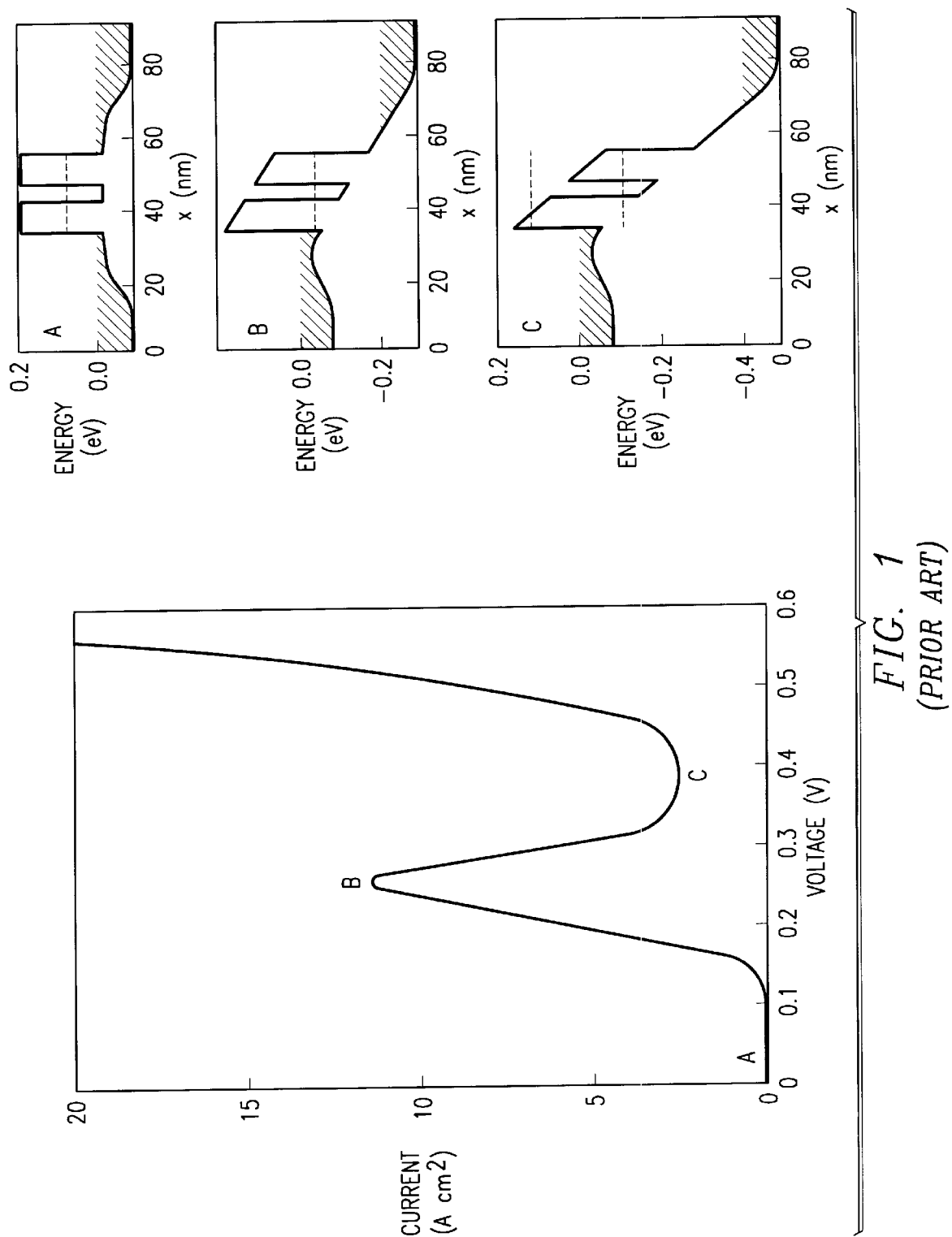
FIG. 1 illustrates a graph of the current through an RTD versus voltage and the corresponding energy level diagrams.
Figure 2:
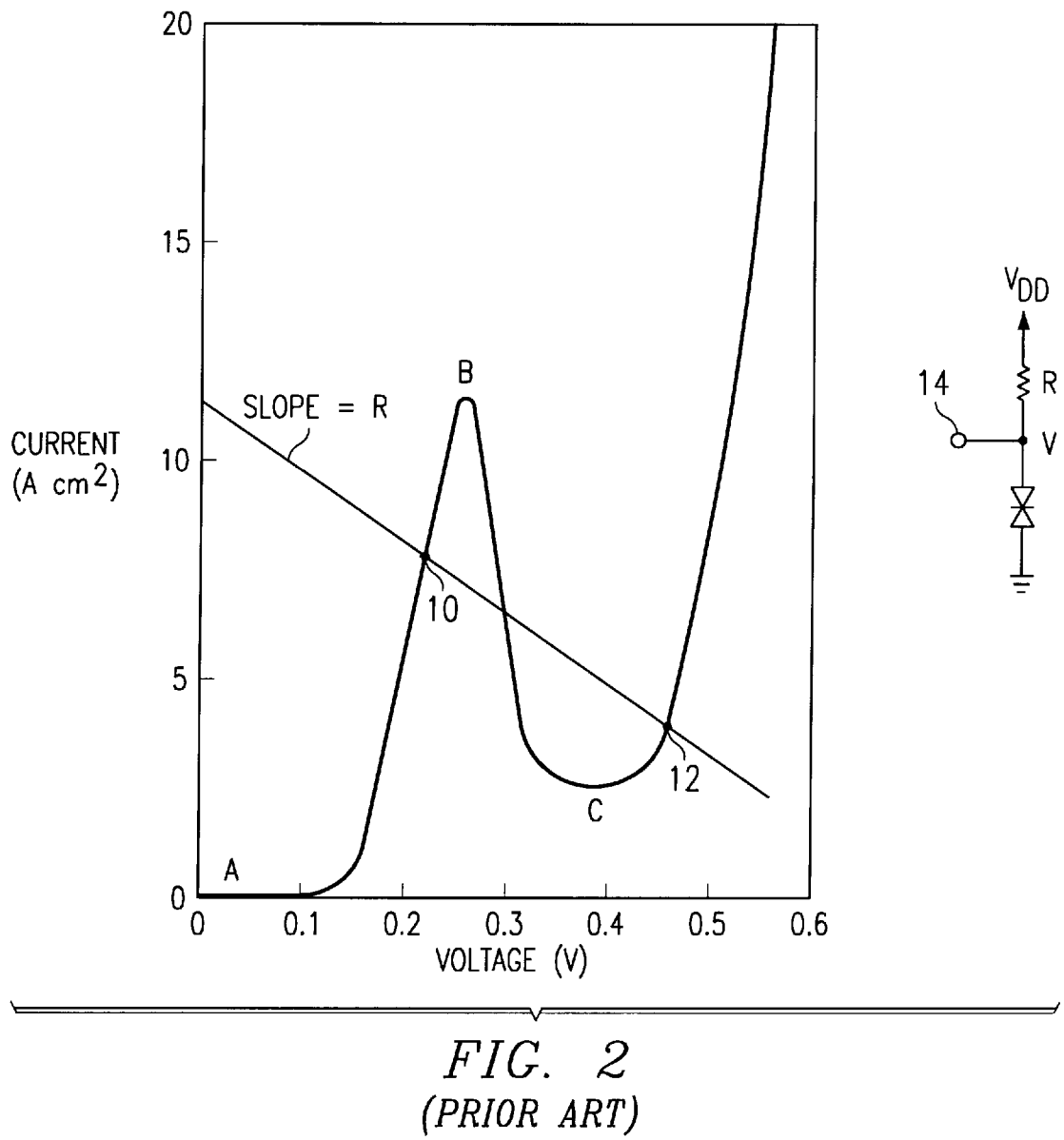
FIG. 2 illustrates the bistable operating points of an RTD with a load resistor.
Figure 3A:
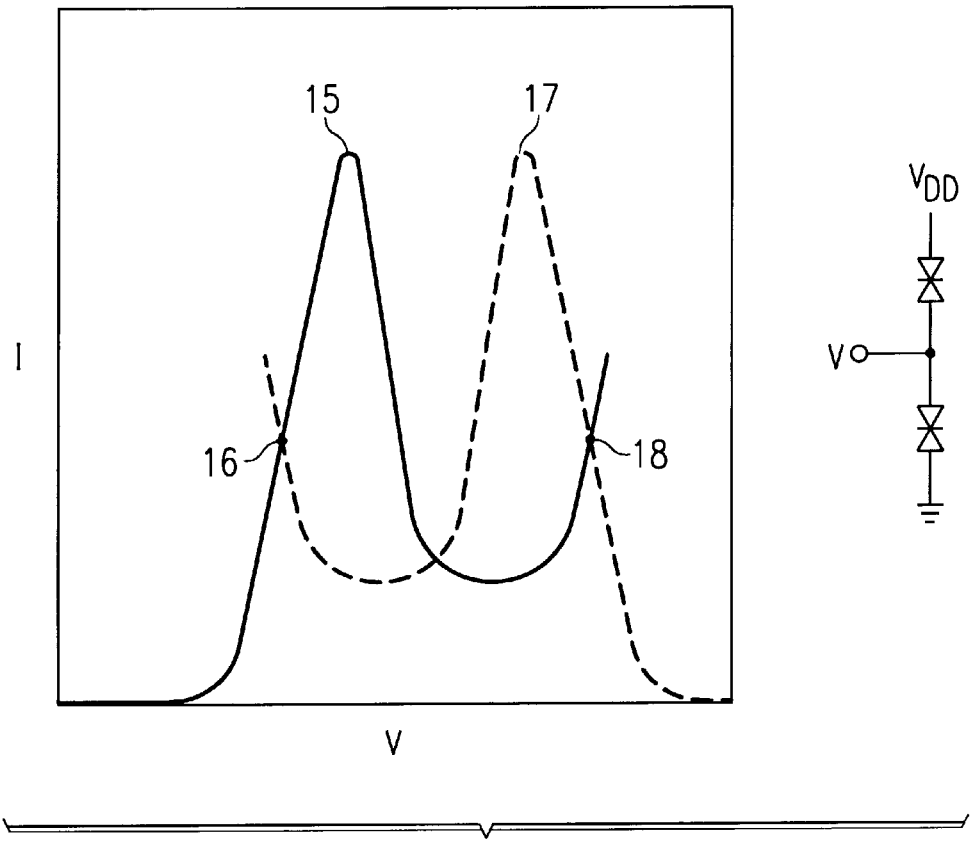
FIG. 3 illustrates the resulting bistable operating points of two RTDs connected in series.
Figure 4:
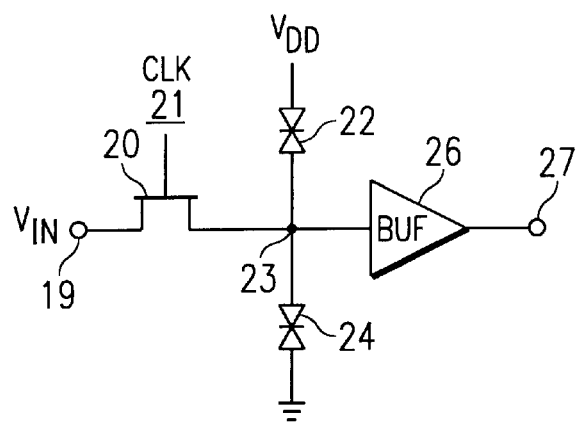
FIG. 4 illustrates a generic single static shift register cell formed from two series connected RTDs to form a static latch which may be driven from a previous input and provides a buffer amplifier to drive a following stage of similar configuration.

Referring initially to FIG. 4, a generic shift register stage, there is shown a series connection of RTDs 22 and 24 whose I–V characteristics are matched and which are supplied with power from $V_{dd}$ to ground. This is the bistable configuration previously described in reference to FIG. 3 which showed peak currents at 15 and 17. For the purpose of discussion, the low voltage state at connection 23 will be considered a binary 0 and the high voltage state as a binary 1. When clock 21 is applied to switching transistor 20, the voltage 19 is tied directly to the junction 23 of the series connected RTDs 22 and 24. If the voltage 19 is lower than peak 15, 23 is forced to the stable point 16, the binary 0 state. Conversely, when the voltage 19 is higher than peak 17, 23 is forced to the stable point 18, the binary 1 state. The clock 21 now turns off switching transistor 21 and the forced state at 23 remains. To facilitate the driving of the next stage of the shift register buffer amplifier 26 is connected between 23 and the output node 27. This buffer amplifier provides isolation between 23 and the next stage as well as providing gain to insure that the next stage receives adequate power to set that stage at a binary 1 or 0.

Figure 5:
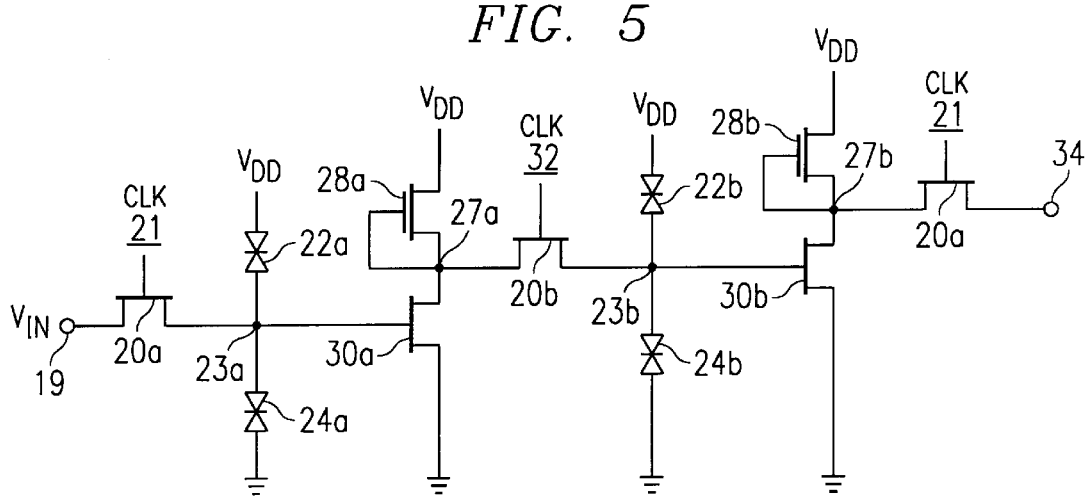
FIG. 5 illustrates a few stages of a static shift register where the buffer amplification stage consists of a cascaded depletion field effect transistor (FET) and enhancement mode FET.

A more complete circuit of a segment of an ultra high speed shift register is shown in FIG. 5 in which the buffer amplifier consists of an enhancement FET 30 to supply gain and a depletion load device 28. Although the devices with like number are duplicates for ease of processing large scale integrated circuits, suffix letters "a" and "b" have been added to distinguish the first stage of the shift register from the second stage to simplify description. Assume that the input voltage at 19 is at binary 1, high voltage. Clock 21 turns on switch transistor 20a. The corresponding switch transistor 20b in the second stage of the shift register is driven by 32 which is the complement of 21 which turns off 20b. As discussed previously, 19 sets connection 23a to the binary 1 state. Connection 23a is common with the gate of 30a. The voltage inversion of the buffer causes 27a to be at a low voltage although switch 20b is still off and therefore no effect is seen by 23b as yet. On the complementary phase of the clock, 20a is turned off and 20b is turned on. This sets the bistable latch composed of 22b and 24b to the binary 0 state, i.e. connection 23b is at low voltage. At this point if we terminate clock signals 21 and 32, the following binary conditions will remain in the static, stable condition—(1) connection 23a is at 1, (2) 27a is at 0, (3) 23b is at 0 and (4) 27b is at 1.

Assume now that input voltage 19 has changed to the binary 0 state while conditions just described prevail. As clock 21 turns on 20a, 23a is set to the 0 state. Output 34 is coupled to 27b which is still in the binary 1 state. On the complementary phase of the clock 32, input 19 and output 34 are terminated. The 0 at 23a is inverted by 30a, 28a and forces 23b to 1, which is inverted by 30b, 28b to a 0. Thus it is seen that the input polarity is duplicated at the output after one full clock cycle. A much longer digital delay can now be realized by cascading numerous like stages.

Figure 6:
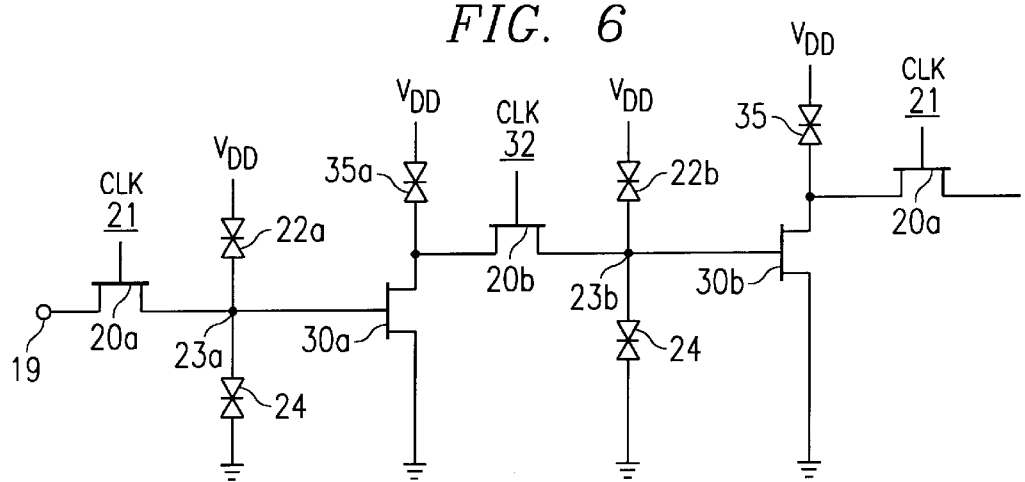
FIG. 6 illustrates a higher speed connection of FIG. 5 by replacing the depletion load FET with an RTD having different characteristics from the RTDs used for the bistable latch configuration.

The functionality of another preferred embodiment shown in FIG. 6 is the same in the digital sense but is capable of much higher speeds. RTD 35a replaces the depletion load transistor 28a of FIG. 5. As mentioned previously, the I–V characteristics of RTD's may be tailored to the application. In this case RTD 35a must supply enough voltage when amplifier 30a is in the low current state to force 23b to the binary 1 state when switch 20b is closed. In the reverse case, 30a will be in the high current state and force 23b to the binary 0 state. The design goals for 35a and 35b are (1) low bias current and (2) adequate logic swing with good noise margin. From the device point of view this means that the peak voltage of 35a and 35b should be approximately half of the swing of 23a and 23b respectively. The step-by-step binary sequence and polarities are the same as FIG. 5.

Figure 7:
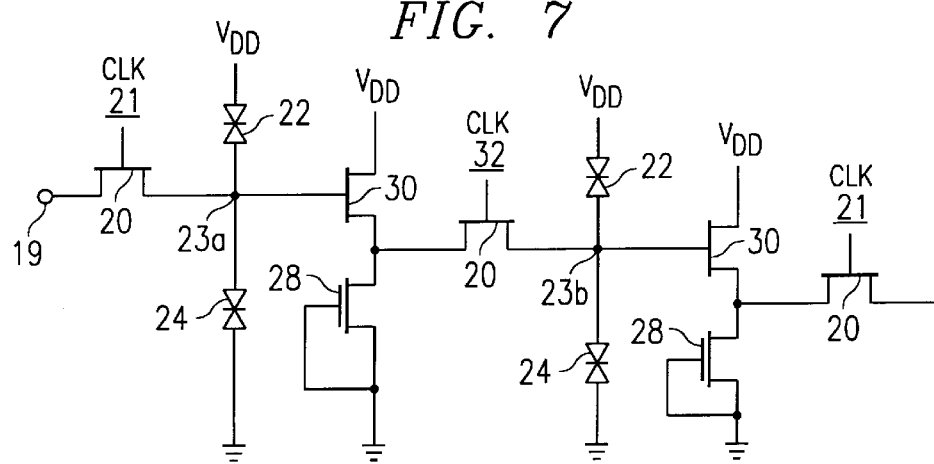
FIG. 7 illustrates a buffer amplifier of the source-follower type to provide increased speed and drive capability for the output stages of the shift register.

The output stages of a shift register are often called on to drive transmission lines to following stages where they may incur severe capacitive loading. In such cases the circuit of FIG. 7 shows another preferred embodiment of this invention. Here the buffer stage between the static latching pairs of RTDs is a noninverting source follower consisting of enhancement mode FET 30 and a source depletion load device 28. The complementary clocking is the same as the previous circuits but in this case there is no inversion between the two shift register stages. In this case when 23*a* is forced to a binary state by clock phase 21, 23*b* is forced to the same binary state during the complementary phase 32. All the other components function as previously described.

While the principles of the present invention are disclosed herein, it will be recognized that various departures may be undertaken in the practice of this invention. For example, a specially designed RTD may also be used as a source follower load as an obvious combination of the functions described in FIG. 5 and FIG. 6. The scope of the invention is not intended to be limited to the particular structures and connections disclosed herein, but should instead be gauged by the breadth of the claims which follow.

What is claimed is:

1. A storage cell for use in a high speed digital static shift register, said storage cells comprising:

a static latch formed of a pair of series-connected negative resistance devices coupled between first and second potentials;

means for setting the binary state of said static latch in accordance with the level of an input signal; and means coupled to said static latch for providing isolation from and gain to a subsequent static latch.

2. The storage cell in accordance with claim 1 wherein said negative resistance devices comprise resonant tunneling diodes.

3. The storage cell in accordance with claim 1 wherein said means for providing isolation and gain includes a buffer amplifier.

4. The storage cell in accordance with claim 3 wherein said buffer amplifier comprises an enhancement FET having its gate coupled to the junction between said pair of negative resistance devices and having its source-drain path coupled in series with a third negative resistance device.

5. The storage cell in accordance with claim 3 wherein said buffer amplifier comprises an enhancement FET and a depletion load FET.

6. The storage cell in accordance with claim 3 wherein said buffer amplifier includes a noninverting source follower comprising an enhancement FET and a source depletion load FET.

7. The storage cell in accordance with claim 1 wherein said means for setting the binary state of said static latch comprises a clocked switching FET.

8. A high speed digital static shift register comprising:

a plurality of storage cells coupled in cascade configuration, each storage cell comprising (a) a static latch formed of a pair of series-connected negative resistance devices coupled between first and second potentials;

(b) means for setting the binary state of said static latch in accordance with the output level of the static latch of the preceding cell of said cascade; and (c) means coupled to said static latch for providing isolation from and gain to the static latch of the subsequent cell of said cascade.

9. The static shift register in accordance with claim 8 wherein said negative resistance devices comprise resonant tunneling diodes.

10. The static shift register in accordance with claim 8 wherein said means for providing isolation and gain includes a buffer amplifier.

11. The static shift register in accordance with claim 10 wherein said buffer amplifier comprises an enhancement FET having its gate coupled to the junction between said pair of negative resistance devices and having its source-drain path coupled in series with a third negative resistance device.

12. The static shift register in accordance with claim 10 wherein said buffer amplifier comprises an enhancement FET and a depletion load FET.

13. The static shift register in accordance with claim 10 wherein said buffer amplifier includes a noninverting source follower comprising an enhancement FET and a source depletion load FET.

14. The static shift register in accordance with claim 8 wherein said means for setting the binary state of said static latch comprises a clocked switching FET.

15. The static shift register in accordance with claim 8 wherein alternate ones of said switching FETs are clocked on one phase of a clock signal and the remaining ones of said switching FETs are clocked on a second phase of said clock signal.

\* \* \* \* \*